(12) United States Patent
Shiga

(10) Patent No.: US 10,910,059 B2
(45) Date of Patent: Feb. 2, 2021

(54) NONVOLATILE SEMICONDUCTOR MEMORY DEVICE

(71) Applicant: Toshiba Memory Corporation, Minato-ku (JP)

(72) Inventor: Hidehiro Shiga, Yokohama (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 16/564,582

(22) Filed: Sep. 9, 2019

(65) Prior Publication Data

US 2020/0294595 A1 Sep. 17, 2020

(30) Foreign Application Priority Data

Mar. 12, 2019 (JP) .................. 2019-045059

(51) Int. Cl.
*G11C 11/34* (2006.01)
*G11C 16/04* (2006.01)
*G11C 11/00* (2006.01)
*G11C 16/34* (2006.01)
*G11C 16/16* (2006.01)

(52) U.S. Cl.
CPC ........ *G11C 16/0483* (2013.01); *G11C 11/005* (2013.01); *G11C 16/16* (2013.01); *G11C 16/344* (2013.01)

(58) Field of Classification Search
CPC ............................................. G11C 16/0483
See application file for complete search history.

(56) References Cited

U.S. PATENT DOCUMENTS

| 7,382,018 | B2 | 6/2008 | Kim et al. |
| 8,008,732 | B2 | 8/2011 | Kiyotoshi et al. |
| 9,202,750 | B2 | 12/2015 | Chen |
| 9,236,394 | B2 | 1/2016 | Rhie |
| 10,134,752 | B2 | 11/2018 | Kim et al. |

(Continued)

FOREIGN PATENT DOCUMENTS

| JP | 2008-78404 A | 4/2008 |
| JP | 2020-92141 A | 6/2020 |

OTHER PUBLICATIONS

U.S. Appl. No. 16/562,372, filed Sep. 5, 2019, Hosotani, K.

*Primary Examiner* — Min Huang
(74) *Attorney, Agent, or Firm* — Oblon, McClelland, Maier & Neustadt, L.L.P.

(57) ABSTRACT

According to the present embodiment, a nonvolatile semiconductor memory device includes a memory string group including k stacked memory strings, each of the memory strings including a plurality of nonvolatile memory cells connected in series, a selection transistor group including k selection transistors, each of the k selection transistors corresponding to each of the k memory strings respectively, the selection transistor group divided into n selection transistor sub-groups, each of the n selection transistor sub-groups including k/n selection transistors, n bit lines arranged in parallel to each of the k memory strings, and n bit line contacts arranged perpendicularly, each of the n bit line contacts connected to each of the n bit lines, respectively, each of the n bit line contacts connected to the k/n selection transistors belonging to the each of the n selection transistor sub-group respectively.

19 Claims, 7 Drawing Sheets

(56) References Cited

U.S. PATENT DOCUMENTS

| | | | |
|---|---|---|---|
| 2007/0297232 A1* | 12/2007 | Iwata | H01L 21/84 |
| | | | 365/185.17 |
| 2008/0259707 A1* | 10/2008 | Kajigaya | G11C 11/406 |
| | | | 365/208 |
| 2010/0002516 A1* | 1/2010 | Sim | H01L 27/11578 |
| | | | 365/185.17 |
| 2011/0286283 A1* | 11/2011 | Lung | H01L 29/7926 |
| | | | 365/185.28 |
| 2020/0176033 A1 | 6/2020 | Hosotani et al. | |

* cited by examiner

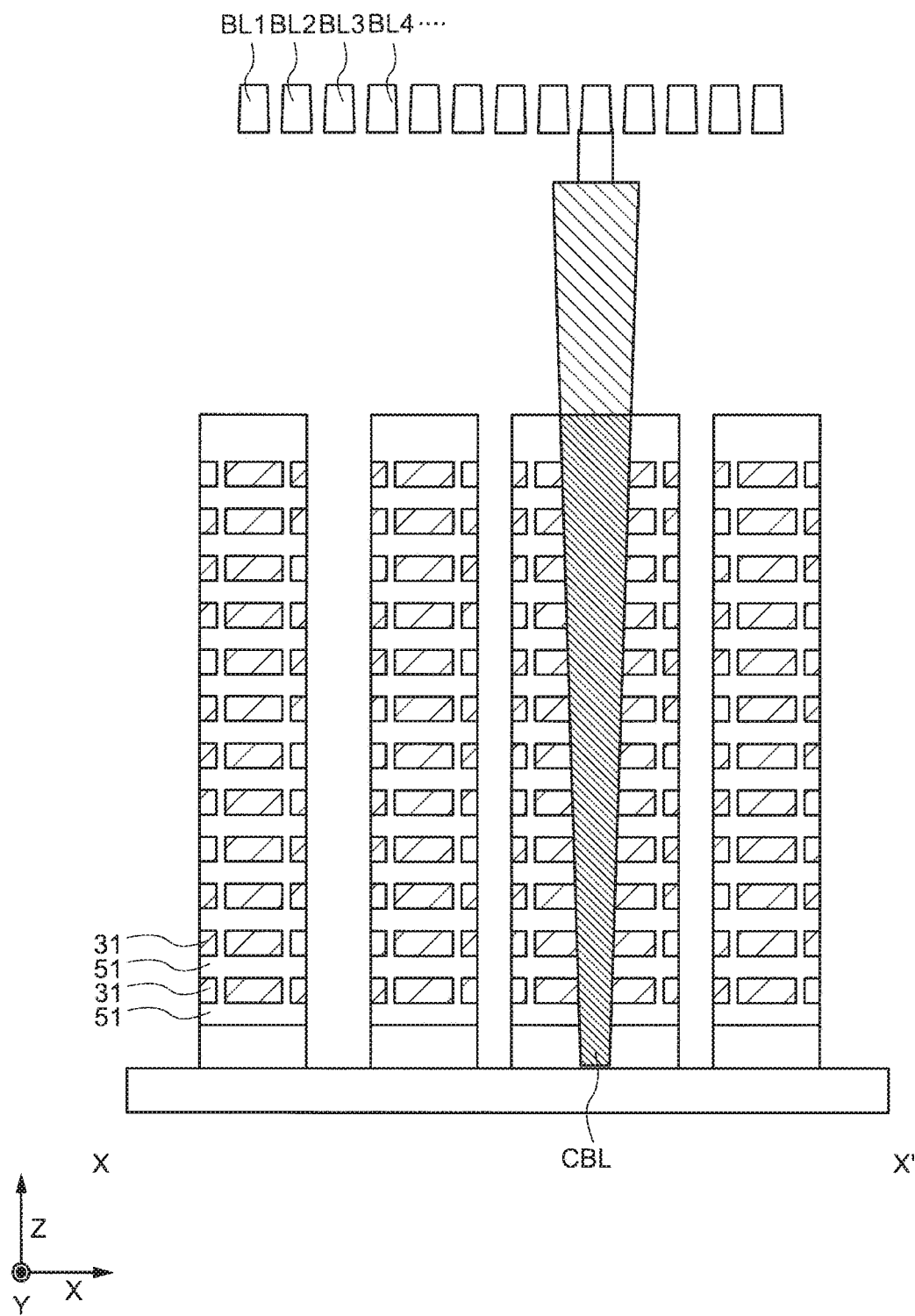

NONVOLATILE SEMICONDUCTOR MEMORY DEVICE

CROSS REFERENCE TO RELATED APPLICATION(S)

This application is based upon and claims the benefit of priority from the prior Japanese Patent Application No. 2019-045059, filed on Mar. 12, 2019, the entire contents of which are incorporated herein by reference.

FIELD

Embodiment described herein relate generally to a nonvolatile semiconductor memory device.

BACKGROUND

A NAND flash memory is known as a nonvolatile semiconductor memory device. In order to increase the capacity of the NAND flash memory, a three-dimensional NAND flash memory having a structure in which many memory cells are stacked has been practically realized. The three-dimensional NAND flash memory has a form in which cell strings are formed vertically and a form in which cell strings are formed horizontally. The latter is sometimes referred to as VGNAND (Vertical Gate NAND).

BRIEF DESCRIPTION OF THE DRAWINGS

FIG. 7 is a cross-sectional diagram of a SGD area of a nonvolatile semiconductor memory device related to a comparative example.

DETAILED DESCRIPTION

Figure 1:
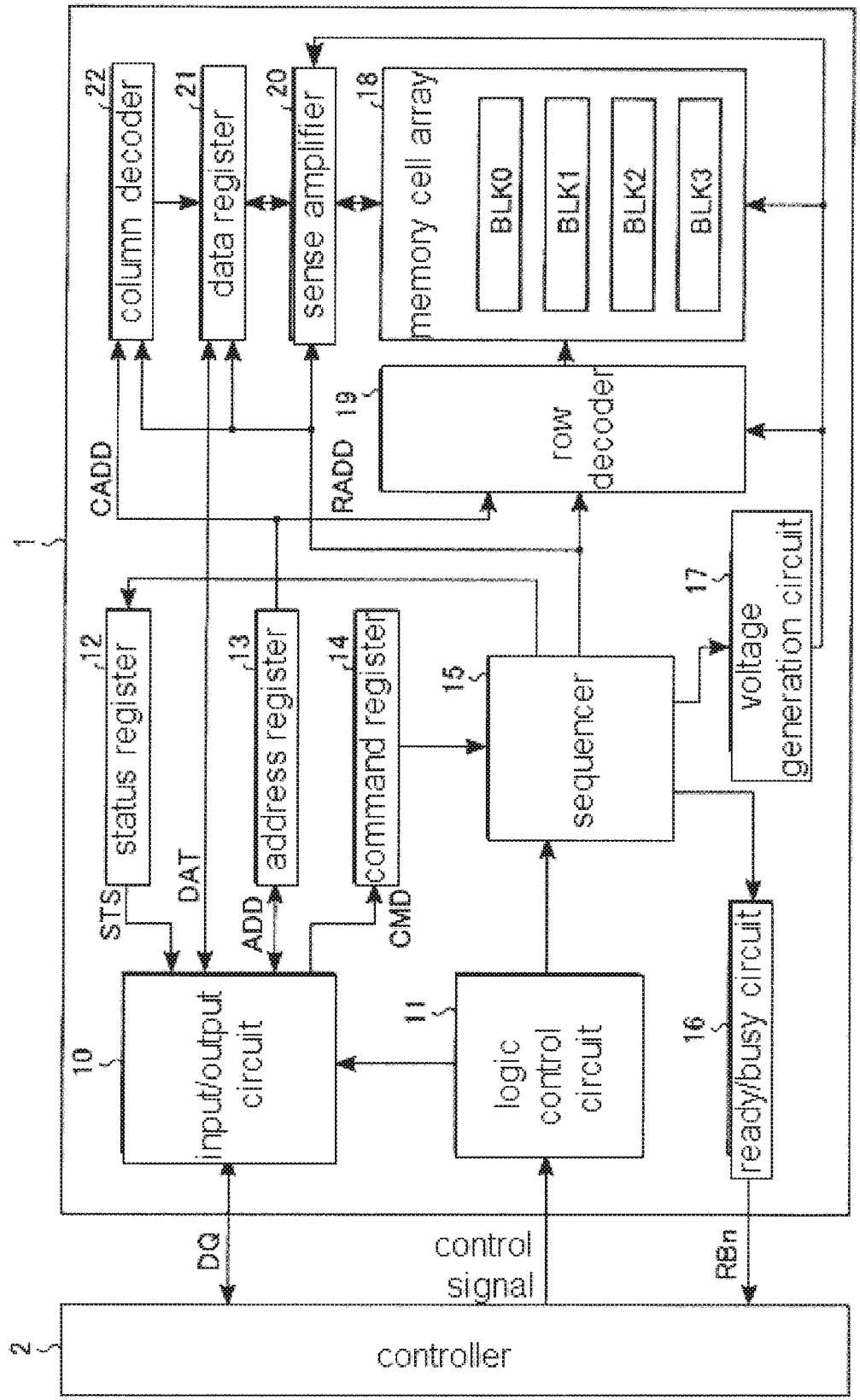
FIG. 1 is a block diagram of a nonvolatile semiconductor memory device related to the present embodiment.

A nonvolatile semiconductor memory device related to the present embodiment includes a memory string group including k stacked memory strings, each of the memory strings including a plurality of nonvolatile memory cells connected in series, k being an integer of 2 or more, a selection transistor group including k selection transistors, each of the k selection transistors corresponding to each of the k memory strings respectively, the selection transistor group divided into n selection transistor sub-groups, each of the n selection transistor sub-groups including k/n selection transistors, n being an integer of 2 or more, n bit lines arranged in parallel to the memory strings, and n bit line contacts arranged perpendicularly, each of the n bit line contacts connected to each of the n bit lines respectively, each of the n bit line contacts connected to the k/n selection transistors belonging to the each of the n selection transistor sub-group respectively.

The nonvolatile semiconductor memory device related to the present embodiment is explained in detail below while referring to the drawings. In the explanation below, the same reference numerals are attached to structural elements which have approximately the same function and structure and a repeated explanation is only made when necessary. In addition, each embodiment shown below exemplifies devices and methods for making concrete the technical concepts of the embodiments and the technical concepts of the embodiments do not limit the material, shape, structure and arrangement of the structural parts described herein. Various modifications of the technical concepts of the embodiments can be made within the scope of the patent claims.

[Overall Structure of Semiconductor Memory Device]

First, the overall structure of a semiconductor memory device is explained using FIG. 1. FIG. 1 is an example of a block diagram showing a basic overall structure of a semiconductor memory device. Although a part of a connection of each block is shown by an arrow line in FIG. 1, the connection between blocks is not limited thereto.

As is shown in FIG. 1, a semiconductor memory device 1 includes an input/output circuit 10, a logic control circuit 11, a status register 12, an address register 13, a command register 14, a sequencer 15, a ready/busy circuit 16, a voltage generation circuit 17, a memory cell array 18, a row decoder 19, a sense amplifier 20, a data register 21 and a column decoder 22.

The input/output circuit 10 controls the input and output of a signal DQ with an external controller 2. The signal DQ includes, for example, data DAT, an address ADD and a command CMD. More specifically, the input/output circuit 10 transmits data DAT which is received from the external controller 2 to the data register 21, transmits an address ADD to the address register 13, and transmits a command CMD to the command register 14. In addition, the input/output circuit 10 transmits status information STS received from the status register 12, data DAT received from the data register 21, and an address ADD received from the address register 13 to the external controller 2.

The logic control circuit 11 receives various control signals from the external controller 2. Next, the logic control circuit 11 controls the input/output circuit 10 and the sequencer 15 according to the received control signal.

The status register 12 temporarily holds status information STS in, for example, a write operation, a read operation and an erase operation, and notifies the external controller 2 whether the operation has been completed normally.

The address register 13 temporarily holds a received address ADD. Next, the address register 13 transfers a row address RADD to the row decoder 19 and transfers a column address CADD to the column decoder 22.

The command register 14 temporarily stores a received command CMD and transfers it to the sequencer 15.

The sequencer 15 controls the overall operations of the semiconductor memory device 1. More specifically, the sequencer 15 for example, controls the status register 12, the ready/busy circuit 16, the voltage generation circuit 17, the row decoder 19, the sense amplifier 20, the data register 21 and the column decoder 22 and the like in response to a received command CMD and executes a write operation, a read operation and an erase operation.

The ready/busy circuit 16 transmits a ready/busy signal RBn to the external controller 2 according to the operation status of the sequencer 15.

The voltage generation circuit 17 generates voltages which are necessary for a write operation, a read operation and an erase operation according to the control of the sequencer 15, and supplies the generated voltages to, for example, the memory cell array 18, the row decoder 19 and the sense amplifier 20. The row decoder 19 and the sense amplifier 20 apply the voltage supplied from the voltage generation circuit 17 to memory cell transistors within the memory cell array 18.

The memory cell array 18 is arranged with a plurality of blocks BLK (BLK0 to BLK3, . . . ) which include a plurality of nonvolatile memory cell transistors (also referred to below as "memory cells") which are correlated with rows and columns. Each block BLK includes a plurality of memory units MU. Each memory unit MU includes a plurality of memory groups MG. The number of blocks BLK within a memory cell array 18, the number of memory units MU within a block BLK, and the number of memory groups MG within a memory unit MU is arbitrary. Details of the memory cell array 18 are described herein.

The row decoder 19 decodes a row address RADD. The row decoder 19 applies a necessary voltage to the memory cell array 18 based on a decoded result.

The sense amplifier 20 senses data which is read from the memory cell array 18 during a read operation. Next, the sense amplifier 20 transmits the read data to the data register 21. The sense amplifier 20 transmits write data to the memory cell array 18 during a write operation.

The data register 21 is arranged with a plurality of latch circuits. The latch circuit temporarily holds write data or read data.

The column decoder 22 decodes a column address CADD, for example, during a write operation, a read operation and an erase operation, and selects a latch circuit within the data register 21 according to the decoded result.

[Circuit Structure of Memory Cell Array]

Figure 2:
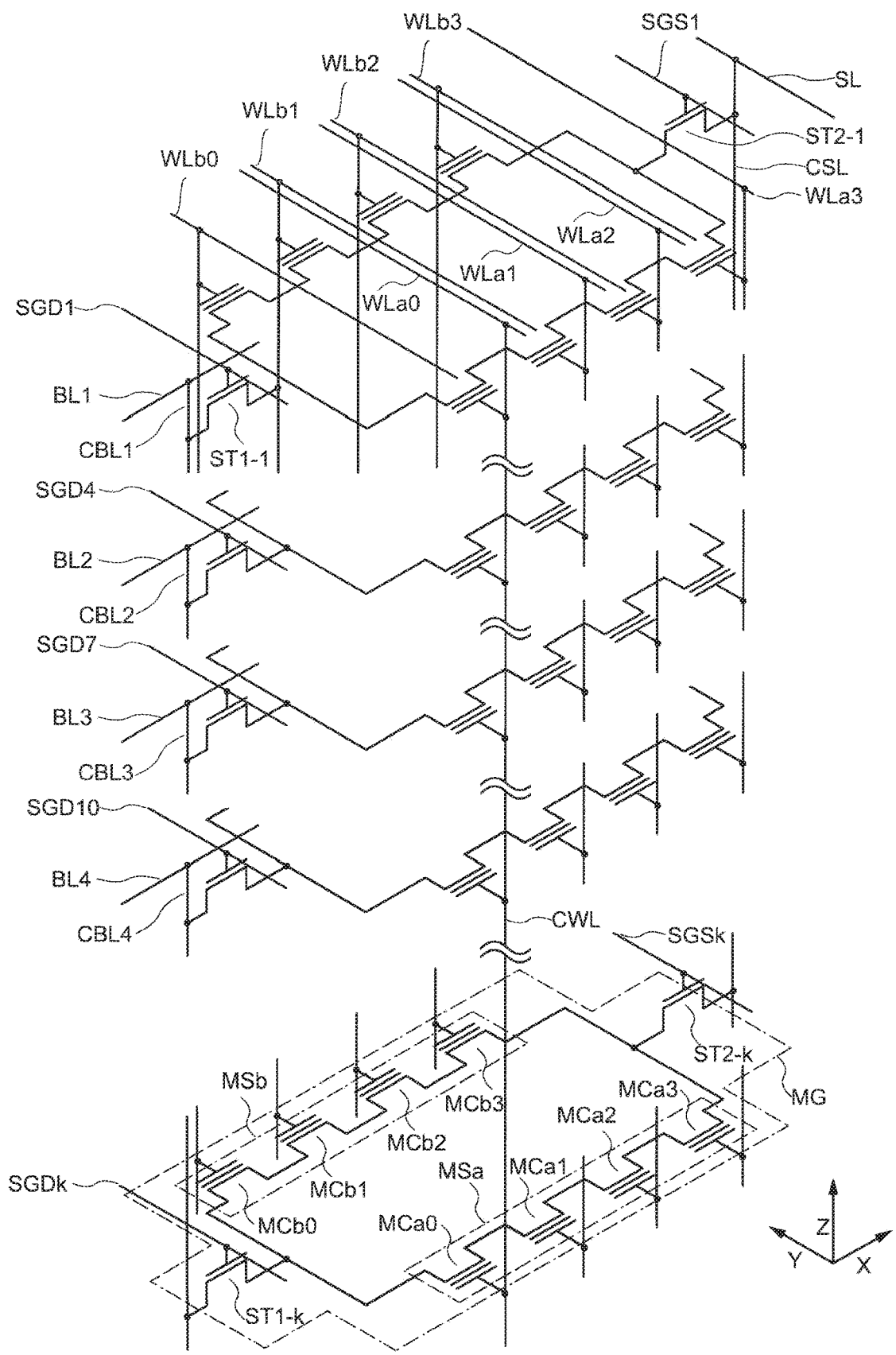
FIG. 2 is a circuit diagram of a memory cell array arranged in a nonvolatile semiconductor memory device related to the present embodiment.

Next, the circuit structure of the memory cell array 18 is explained using FIG. 2. FIG. 2 is a circuit diagram of the memory cell array 18. The example in FIG. 2 shows a plurality of memory groups MG corresponding to a plurality of semiconductor layers stacked in a Z direction and which are commonly connected to four bit line contacts CBL. In the explanation below, a drain side is denoted as SGD1 and a source side is denoted as SGS1 among selection gate lines which correspond to the uppermost semiconductor layer 31 (memory group MG). The drain side is denoted as SGDk (k is an integer of 2 or more), and the source side is denoted as SGSk among selection gate lines which correspond to the lowermost semiconductor layer 31 (memory group MG).

As is shown in FIG. 2, the memory cell array 18 includes a plurality of memory groups MG. Each memory group MG includes two memory strings MSa and MSb, and includes selection transistors ST1 and ST2. In the case when the memory strings MSa and MSb are not distinguished from one another, they are denoted below as memory strings MS.

The memory string MSa includes, for example, four memory cell transistors MCa0 to MCa3. Similarly, the memory string MSb includes, for example, four memory cell transistors MCb0 to MCb3. In the case when the memory cell transistors MCa0 to MCa3 and MCb0 to MCb3 are not distinguished from one another, they are denoted below as memory cell transistors MC.

A memory cell transistor MC is arranged with a control gate and a charge storage layer, and holds data in a nonvolatile means. The memory cell transistor MC may be a MONOS type which uses an insulating layer as a charge storage layer, or may be an FG type which uses a conductive layer as a charge storage layer. In the present embodiment, the FG type is explained below as an example. The number of memory cell transistors MC which are included in each of the memory strings MS may be 8, 16, 32, 48, 64, 96 or 128 and the number is not limited thereto.

Current paths of the memory cell transistors MCa0 to MCa3 which are included in the memory string MSa are connected in series. Similarly, current paths of the memory cell transistors MCb0 to MCb3 which are included in the memory string MSb are connected in series. The drains of the memory cell transistors MCa0 and MCb0 are commonly connected to a source of a selection transistor ST1. The sources of the memory cell transistors MCa3 and MCb3 are commonly connected to the drain of the selection transistor ST2. The number of selection transistors ST1 and ST2 which are included in the memory group MG is arbitrary and may be one or more.

The gates of the memory cell transistors MC of the plurality of memory groups MG which are arranged along the Z direction are commonly connected to one word line WL via a contact plug CWL. More specifically, for example, the gates of the plurality of memory cell transistors MCa0 arranged along the Z direction are commonly connected to a word line WLa0. Similarly, the gates of the memory cell transistors MCa1, MCa2 and MCa3 are respectively connected to word lines WLa1, WLa2 and WLa3. The gates of the memory cell transistors MCb0 to MCb3 are respectively connected to word lines WLb0 to WLb3.

The drains of the selection transistors ST1 of the plurality of memory groups MG which are arranged along the Z direction are connected to a corresponding one bit line BL1 to BL4 via any one of the bit line contacts CBL1 to CBL4. The plurality of memory groups MG commonly connected to one bit line BL are grouped into a memory unit MU. The gates of the selection transistors ST1 of the plurality of memory groups MG which are arranged along the Z direction are connected to different selection gate lines SGD. More specifically, for example, the gate of the selection transistor ST1 which corresponds to the memory group MG which is arranged in the uppermost layer is connected to the selection gate line SGD1. The gate of the selection transistor ST1 which corresponds to the memory group MG which is arranged in the lowermost layer is connected to the selection gate line SGDk. In FIG. 2, the bit line contacts CBL1 to CBL4 and the bit lines BL1 to BL4 are arranged along the Z direction for each memory group MG of the uppermost layer among the plurality of memory groups MG which are connected to the common bit line contact CBL. However, the bit line contacts CBL to CBL4 may have the same length in the Z direction and at this time, the bit lines BL1 to BL4 may be collectively arranged on the same layer.

The sources of the selection transistors ST2 of the plurality of memory groups MG which are arranged along the Z direction are commonly connected to one source line SL via a contact plug CSL. The gates of the selection transistors ST2 of the plurality of memory groups MG which are arranged along the Z direction are connected to different selection gate lines SGS. More specifically, for example, the gate of the selection transistor ST2 which corresponds to the memory group MG which is arranged in the uppermost layer is connected to the selection gate line SGS1, and the gate of the selection transistor ST2 which corresponds to the memory group MG which is arranged in the lowermost layer is connected to the selection gate line SGSk.

[Simultaneous Selection of a Plurality of SGD's]

The operation of the memory cell array shown in FIG. 2 is explained. If the number of layers of a memory string pair is given as k and a bit line with respect to one memory string (pair) pitch is given as n, then the memory string pair is grouped into n memory units MU (k and n are integers of 2 or more). Each memory unit MU includes k/n layers of memory string pairs and each includes k/n number of SGD's.

An example corresponding to the case where the number of layers of memory string pairs is k=12 and the number of bit lines is n=4 with respect to one memory string (pair) pitch is explained as a specific example. The memory strings (pairs) are stacked with 12 layers of MS1, MS2, MS3, MS4, MS5, . . . , MS12. SGD's are also arranged for each memory string (pair) and correspond to SGD1, SGD2, SGD3, SGD4, SGD5, . . . SGD12. Since four bit lines correspond to one memory string (pair) pitch, the bit lines BL1, BL2, BL3 and BL4 extend in the extending direction of the memory string. The bit lines are respectively connected in a perpendicular direction to the bit line contacts CBL1, CBL2, CBL3 and CBL4. SGD1, SGD2 and SGD3 are connected to the bit line contact CBL1. SGD4, SGD5 and SGD6 are connected to the bit line contact CBL2. SGD7, SGD8 and SGD9 are connected to the bit line contact CBL3. SGD10, SGD11 and SGD12 are connected to the bit line contact CBL4.

In this way, the memory unit MU0 is formed from MS1, MS2 and MS3, the memory unit MU1 is formed from MS4, MS5 and MS6, the memory units MU2 from MS7, MS8 and MS9, and the memory unit MU3 is formed from MS10, MS11 and MS12 respectively.

The memory units MU0, MU1, MU2 and MU3 form one block BLK which operates simultaneously. As a result, for example, SGD1, SGD4, SGD7, and SGD10 are simultaneously selected (a potential sufficient to cause these transistors conduct is supplied from the row decoder 19 to the gate, and its control is carried out by the sequencer 15). As another example, SGD2, SGD5, SGD8 and SGD11 may be simultaneously selected and SGD3, SGD6, SGD9 and SGD12 may also be simultaneously selected.

In this way, it is possible to simultaneously select a plurality of layers from the stacked plurality of layers of memory strings. A unit of erasure is also this block BLK.
[Structure of Memory Cell Area, SGD Area, Step Contact Area]

Figure 3:
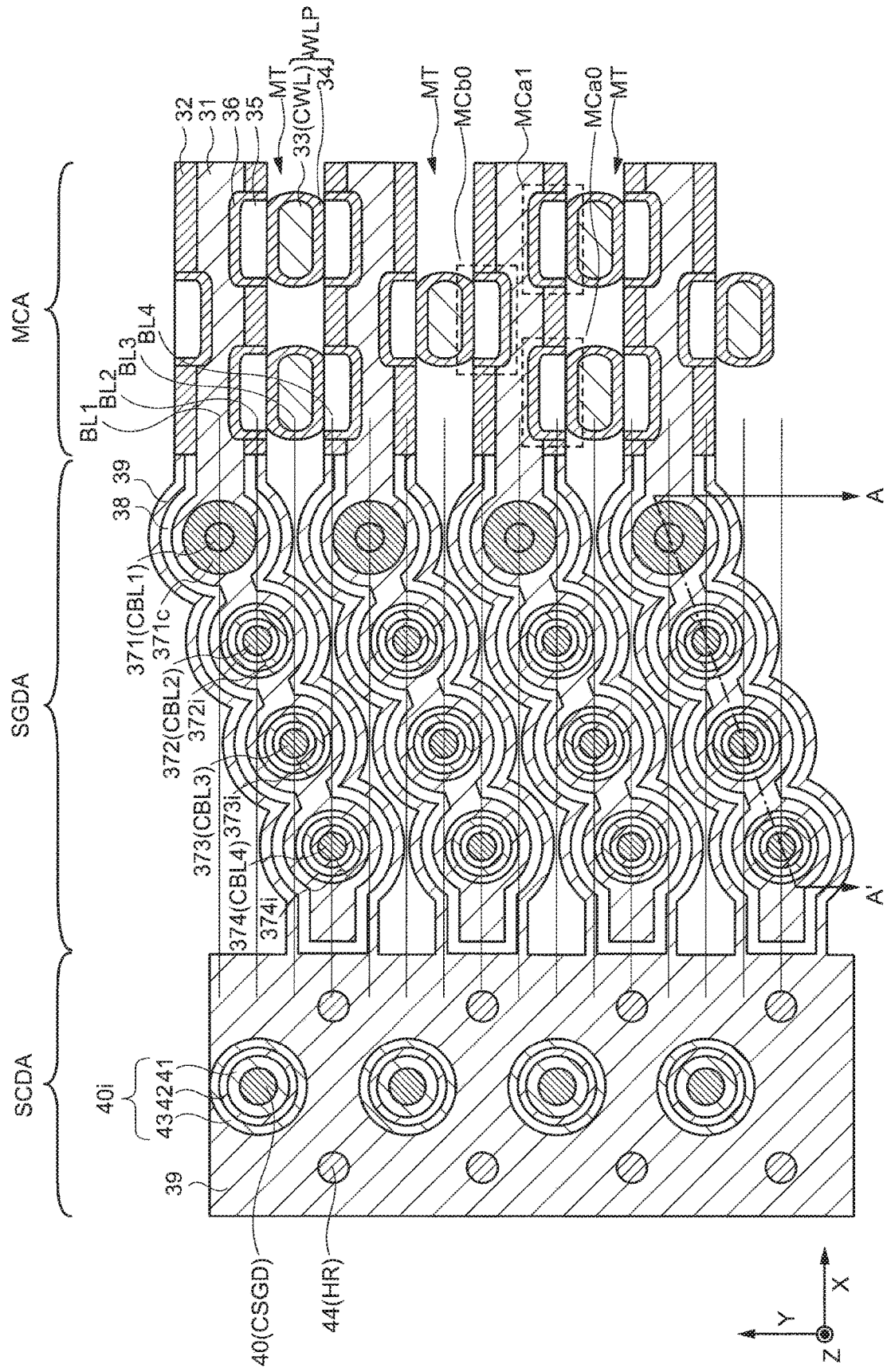
FIG. 3 is a planar view diagram showing a memory cell area and a SGD area of a nonvolatile semiconductor memory device related to the present embodiment.

Next, details of a planar structure of the memory cell array 18 in the memory cell area MCA, the SGD area SGDA, and the step contact area SCDA which corresponds to the selection gate line SGD is explained using FIG. 3.

As is shown in FIG. 3, a memory trench MT is arranged between two semiconductor layers 31 which are arranged along an X direction, and the memory trench MT is embedded with an insulating layer (not shown in the diagram).

In the memory cell area MCA, an insulating layer 32 is arranged on the side surface of the semiconductor layer 31. The insulating layer 32 functions as an etching stopper when forming an insulating layer 36 (tunnel insulating film) and a charge storage layer 35 described herein.

In addition, in the memory cell area MCA, a plurality of word line pillars WLP are arranged in order to separate the memory trenches MT. A word line pillar WLP includes a conductive layer 33 which extends in the Z direction and an insulating layer 34 which is in contact with the side surface of the conductive layer 33. The conductive layer 33 functions as a contact plug CWL. The insulating layer 34 functions as a block insulating film of a memory cell transistor MC.

A charge storage layer 35 and an insulating layer 36 are arranged between the word line pillar WLP and the semiconductor layer 31 in a Y direction so as to separate the insulating layer 32. The insulating layer 36 functions as a tunnel insulating film. More specifically, one side surface of the charge storage layer 35 along the X direction in the XY plane contacts the insulating layer 34 of a word line pillar WLP, and the other side surface (other side surface along the X direction and two side surfaces along the Y direction) contact with the insulating layer 36. A part of the side surface of the insulating layer 36 contacts with the semiconductor layer 31 and the insulating layer 32.

Therefore, between the conductive layer 33 and the semiconductor layer 31, the insulating layer 34, the charge storage layer 35 and the insulating layer 36 are formed in order from the conductive layer 33 towards the semiconductor layer 31. An area including a part of the semiconductor layer 31, a part of the conductive layer 33, a part of the insulating layer 34, the charge storage layer 35 and the insulating layer 36 (also denoted as an intersection area between the semiconductor layer 31 and the word line pillar WLP) function as a memory cell transistor MC. In the example in FIG. 3, in one semiconductor layer 31, the intersection area between the semiconductor layer 31 and the word line pillar WLP which is arranged on a lower side in the diagram of FIG. 3 functions as a memory cell transistor MCa, and an intersection area between the semiconductor layer 31 and the word line pillar WLP which is arranged on the upper side of the diagram in FIG. 3 functions as a memory cell transistor MCb. In addition, for example, a plurality of memory cell transistors MCa which correspond to one semiconductor layer 31 are denoted as MCa0, MCa1, . . . in order from the SGD area SGDA towards the SGS area SGSA. The memory cell transistors MCb0, MCb1, . . . are also the same.

In the SGD area, conductive layers 371, 372, 373 and 374 are arranged to pass through the semiconductor layer 31. The conductive layers 371, 372, 373 and 374 respectively function as bit line contacts CBL1, CBL2, CBL3 and CBL4. In the example in FIG. 3, the semiconductor layer 31 has a circular shape in a connection area with the conductive layers 371, 372, 373 and 374. In addition, a plurality of the circular shapes are linked misaligned by a ¼ pitch in the Y direction. The shape of the semiconductor layer 31 in the connection area with the conductive layers 371, 372, 373, 374 is arbitrary. For example, the shape of the connection area may be a plurality of linked polygons. In the connection area, when holes of the bit line contacts CBL1, CBL2, CBL3 and CBL4 which pass through the semiconductor layer 31 are processed, any shape is possible as long as a sufficient margin can be secured in the XY plane of the holes of bit line contact CBL so that they do not protrude from the semiconductor layer 31 due to manufacturing variations.

In the SGD area SGDA, the insulating layer 38 is arranged so as to surround the side surface of the semiconductor layer 31, that is, is arranged in contact with an end part of the semiconductor layer 31 in the X direction and the side surface of the semiconductor layer 31 along the X direction diagonally (X-Y direction). The insulating layer 38 functions as a gate insulating film of the selection transistors ST1-1 to ST1-$k$. A side surface of the insulating layer 38 which faces the side surface in contact with the semiconductor layer 31 contacts with the conductive layer 39. The insulating layer 38 is preferred to be formed from a SiON film. If adjustment of a threshold voltage of the selection transistors ST1-1 to ST1-$k$ is necessary, it is preferred that the insulating layer 38 is formed from an ONO film comprised from a three-layer structure of SiO2/SiN/SiO2 instead of the SiON film.

The conductive layer 39 functions as selection gate lines SGD1 to SGDk. More specifically, the conductive layer 39 includes a first part which extends in the Y direction, and a plurality of second parts which extend diagonally in the X direction in the SGD area, one side surface thereof which extends diagonally along the X direction contacts the insulating layer 38, and an end part thereof is connected to the first part of the conductive layer 39.

In the SGD area, an area including the semiconductor layer 31, the insulating layer 38 and a second part of the conductive layer 39 from the memory cell area to the conductive layers 371, 372, 373, and 374, functions as selection transistors ST1-1 to ST1-k. More specifically, the second part of the conductive layer 39 functions as a gate electrode of the selection transistors ST1-1 to ST1-k, the insulating layer 38 functions as a gate insulating film of the selection transistors ST1-1 to ST1-k, and channels of the selection transistors ST1-1 to ST1-k are formed in the semiconductor layer 31.

The conductive layers 371, 372, 373, and 374 are selectively connected with the semiconductor layer 31. That is, one of the conductive layers 371, 372, 373 and 374 is electrically connected with the semiconductor layer 31, and the remaining three layers are formed with insulating layers 371i, 372i, 373i and 374i between the semiconductor layers 31. In the example in FIG. 3, only the conductive layer 371 is electrically connected with the semiconductor layer 31, and the conductive layers 372, 373, and 374 are not electrically connected with the semiconductor layer 31. As a result, this part does not form a selection transistor. A conductive layer 371c is arranged between the conductive layer 371 which is electrically connected and the semiconductor layer 31. The insulating layers 372i, 373i, and 374i are arranged between the conductive layers 372, 373, and 374 which are not electrically connected and the semiconductor layer 31. A detailed structure of the SGD area is described herein.

In the step contact area SCDA, a conductive layer 40 and an insulating layer 44 are arranged passing through the first part of the conductive layer 39. The conductive layer 40 functions as a contact plug CSGD. The insulating layer 44 functions as a dummy pillar HR. The conductive layer 40 is electrically connected to any one of the first parts of the conductive layer 39 which are stacked in the Z direction. An insulating layer 40i is formed between the conductive layer 39 and the conductive layer 40 which are not electrically connected. The insulating layer 40i is formed from the insulating layers 41, 42 and 43. The insulating layer 41 is arranged so as to contact with a side surface (also denoted as "outer surface" herein) of the conductive layer 40. The insulating layer 42 is arranged so as to contact with a part of the outer surface of the insulating layer 41. The insulating layer 43 is arranged so as to contact with the outer surface of the insulating layer 42.

[Structure and Operation of SGD Transistor]

The local structure of the SGD transistor is as described below. The semiconductor layer 31 is an i-type polysilicon or a p-type polysilicon doped with B (boron). On the other hand, the conductive layer 371 (CBL1) is an n+type polysilicon densely doped with P (phosphorus) or As (arsenic). As a result, an n-diffusion layer is formed in the periphery of the conductive layer 371.

The operation of the SGD transistor is described as below. The conductive layer 39 which is connected with the conductive layer 40 corresponds to the gate of the SGD transistor, and the insulating layer 38 corresponds to the gate insulating film of the SGD transistor. When a voltage Vg applied to the conductive layer 39 is low, the transistor is in a cut off state since the semiconductor layer 31 is an i-type polysilicon or p-type polysilicon. When the voltage Vg applied to the conductive layer 39 is increased, an inversion layer is formed from the vicinity of the insulating layer 38 of the semiconductor layer 31. When the voltage Vg which is applied to the conductive layer 39 is sufficiently high, the inversion layer which is formed on the semiconductor layer 31 contacts with the n-diffusion layer in the periphery of the conductive layer 371. That is, the transistor becomes conductive.

[Cross-Sectional Structure of SGD Area]

Figure 4:
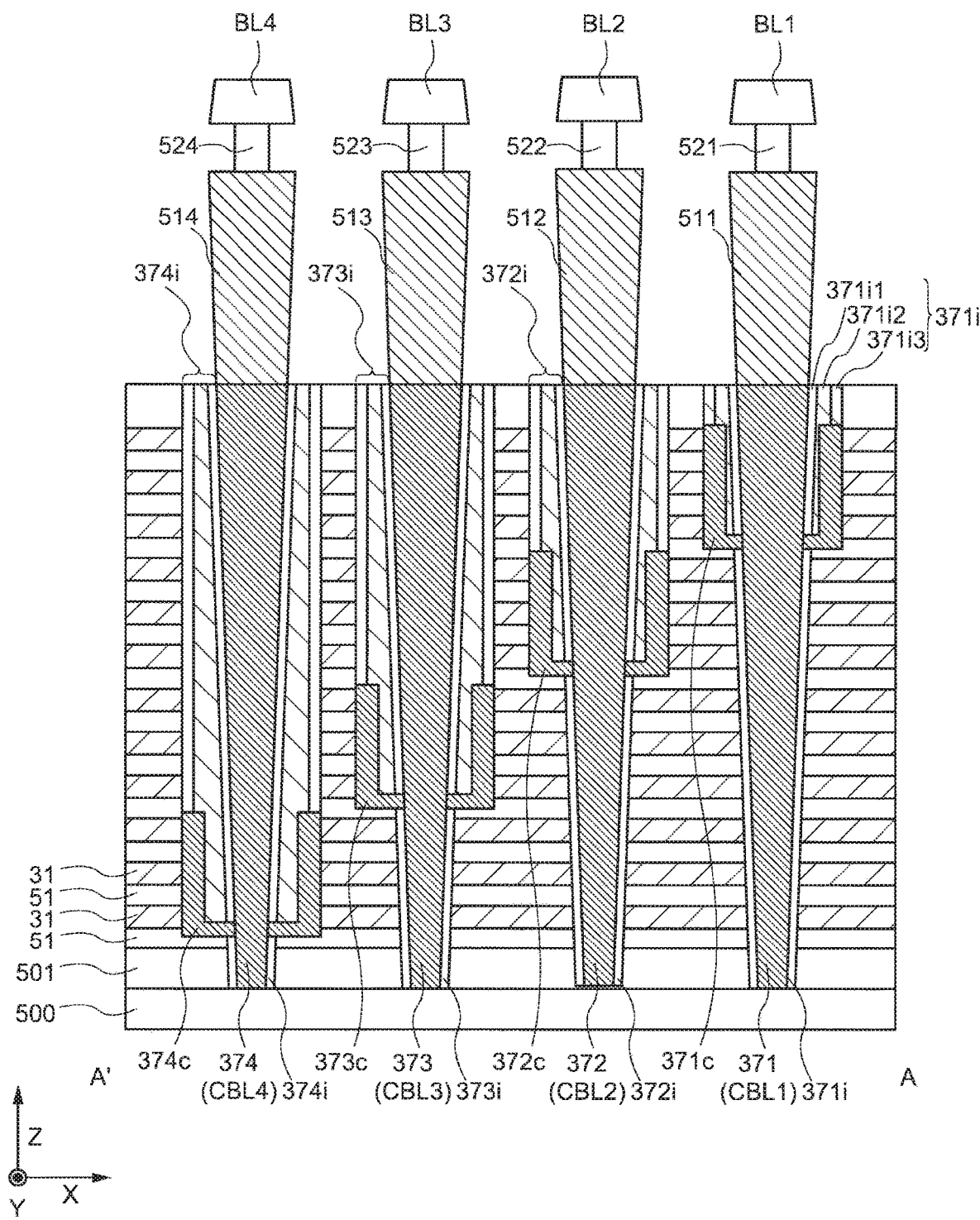
FIG. 4 is a cross-sectional diagram of a SGD area of a nonvolatile semiconductor memory device related to the present embodiment.

FIG. 4 is a cross-sectional diagram along the line A-A' in FIG. 3. A form is shown in which SGD1 to SGDk (SGD12) are connected to each memory string. An insulating layer 51 and a semiconductor layer 31 are stacked in order above an insulating layer 500 on a semiconductor substrate which is not shown in the diagram. The conductive layers 371, 372, 373 and 374 are formed to pass through this stacked layer body vertically, and the insulating layers 371i, 372i, 373i and 374i are formed around thereof. The insulating layers 371i, 372i, 373i, 374i are respectively formed from insulating layers 371i1 to 371i3, 372i1 to 372i3, 373i1 to 373i3 and 374i1 to 374i3. For example, the insulating layer 371i1 is arranged so as to contact with the side surface (also denoted as "outer surface" herein) of the conductive layer 371. The insulating layer 371i2 is arranged so as to contact with a part of the outer surface of the insulating layer 371i1. The insulating layer 371i3 is arranged so as to contact with a part of the outer surface of the insulating layer 371i2. The insulating layers 371i, 372i, 373i, 374i are partially separated, and the conductive layers 371c, 372c, 373c and 374c are partially formed here. The insulating layers 371i, 372i, 373i and 374i are formed from silicon dioxide, and the conductive layers 371c, 372c, 373c and 374c are formed from an n+type polysilicon densely doped with P (phosphorus) or As (arsenic) or a metal or metal nitride such as W (tungsten) or TiN (titanium nitride). The conductive layers 371c, 372c, 373c and 374c function as HU (hook-up) layers since they are layers connecting a plurality of layers.

The conductive layers 371, 372, 373 and 374 are respectively connected to the conductive layers 511, 512, 513 and 514, and are respectively connected to the bit lines BL1, BL2, BL3 and BL4 via the conductive plugs 521, 522, 523 and 524. In this way, SGD1, SGD2 and SGD3 are connected to the bit line contact CBL1. In addition, SGD4, SGD5 and SGD6 are connected to the bit line contact CBL2. In addition, SGD7, SGD8 and SGD9 are connected to the bit line contact CBL3. In addition, SGD10, SGD11 and SGD12 are connected to the bit line contact CBL4.

[Structure of Memory Cell Area, SGS Area, Step Contact Area]

Figure 5:
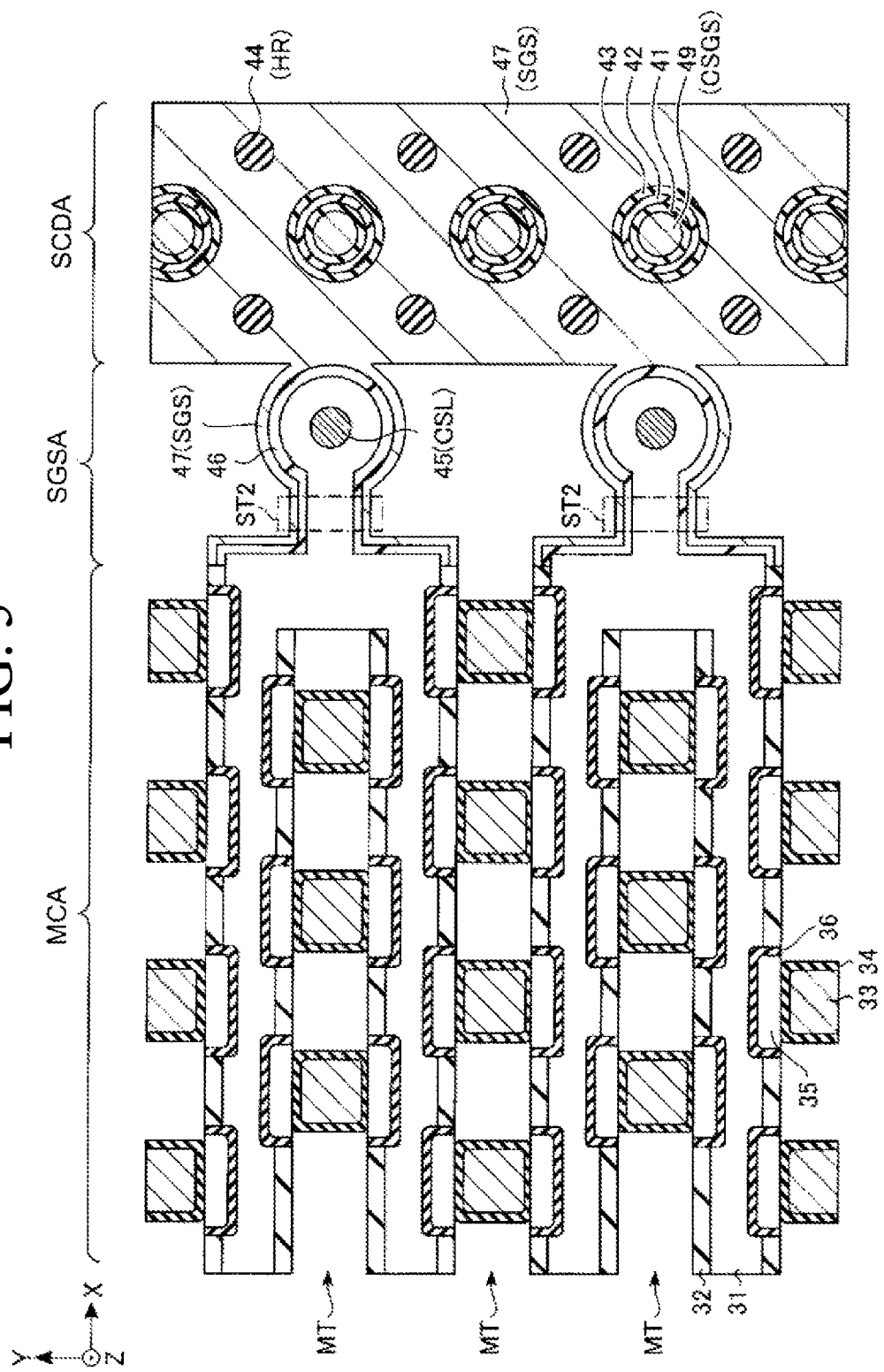
FIG. 5 is a planar view diagram showing a memory cell area and a SGS area of a nonvolatile semiconductor memory device related to the present embodiment.

Next, the details of a planar structure of the memory cell array 18 in the memory cell area MCA, SGS area SGSA and the step contact area SCSA which corresponds to the selection gate line SGS are described using FIG. 5.

As is shown in FIG. 5, two semiconductor layers 31 are commonly connected in the vicinity of the SGS area SGSA, and a conductive layer 45 which passes through the semiconductor layer 31 is arranged in the SGS area. The conductive layer 45 functions as a contact plug CSL. Similar to FIG. 3, in the example in FIG. 5, the semiconductor layer 31 has a circular shape in a connection area with the conductive layer 45. The conductive layer 45 may also be formed from the same conductive material as the conductive layers 371, 372, 373 and 374 (bit line contacts CBL1 to CBL4).

In the SGS area SGSA, similar to the insulating layer 38, the insulating layer 46 is arranged so as to surround the side surface of the semiconductor layer 31. The insulating layer 46 functions as a gate insulating film of the selection transistor ST2. The insulating layer 46 may be formed from the same insulating material as the insulating layer 38.

A side surface of the insulating layer 46 which faces the side surface in contact with the semiconductor layer 31 contacts with the conductive layer 47. The conductive layer 47 functions as a selection gate line SGS. More specifically, the conductive layer 47 includes a first part extending in the Y direction, and a plurality of second parts one surface thereof is in contact with the insulating layer 46 in the SGS area, and an end part thereof contacts the first part of conductive layer 47. The conductive layer 47 may be formed from the same conductive material as the conductive layer 39 (selection gate lines SGD1 to SGDk).

In the SGS area, an area including the semiconductor layer 31, the insulating layer 46 and the second part of the conductive layer 47 from the memory cell area to the conductive layer 45 function as a selection transistor ST2. More specifically, the second part of the conductive layer 47 functions as the gate electrode of the selection transistor ST2, the insulating layer 46 functions as the gate insulating film of the selection transistor ST2, and a channel of the selection transistor ST2 is formed in the semiconductor layer 31.

In the step contact area, a conductive layer 49 and an insulating layer 44 are arranged to pass through the first part of the conductive layer 47. The conductive layer 49 functions as a contact plug CSGS. The conductive layer 49 is electrically connected to any one of the first parts of the conductive layers 47 which are stacked in the Z direction. Similar to the step contact area which corresponds to the selection gate line SGD, the insulating layers 41 to 43 are arranged to surround conductive layer 49. Furthermore, the conductive layer 49 may be formed from the same conductive material as the conductive layer 40 (contact plug CSGD).

In the SGS area SGSA, although an example in which one SGS is arranged for each memory string pair is shown, similar to the SGD area SGDA, a plurality (for example, four) of SGS may be arranged for each memory string pair. In this case, it is possible to perform a write and erase operation with respect to a memory string pair from both terminals.

Effect of the Embodiment

By forming the memory cell array as described above, it is possible to reduce the block size. When one pair of memory strings MSa and MSb are formed on a semiconductor substrate, the pitch is equal to four bit lines. That is, four bit lines BL1, BL2, BL3 and BL4 can be arranged in the width of one pair of memory strings MSa and MSb. According to the above embodiment described above, the bit line contacts CBL1, CBL2, CBL3 and CBL4 are respectively arranged corresponding to the bit lines BL1, BL2, BL3 and BL4, and are connected to the pair of memory strings MSa and MSb in different layers via a selection gate ST1. The individual bit line contacts CBL1, CBL2, CBL3 and CBL4 are connected to SGD's of ¼ of all the layers. In other words, the SGD's are grouped into four, and the BL's are grouped into a bundle of four and are correspondingly connected respectively.

Figure 6:
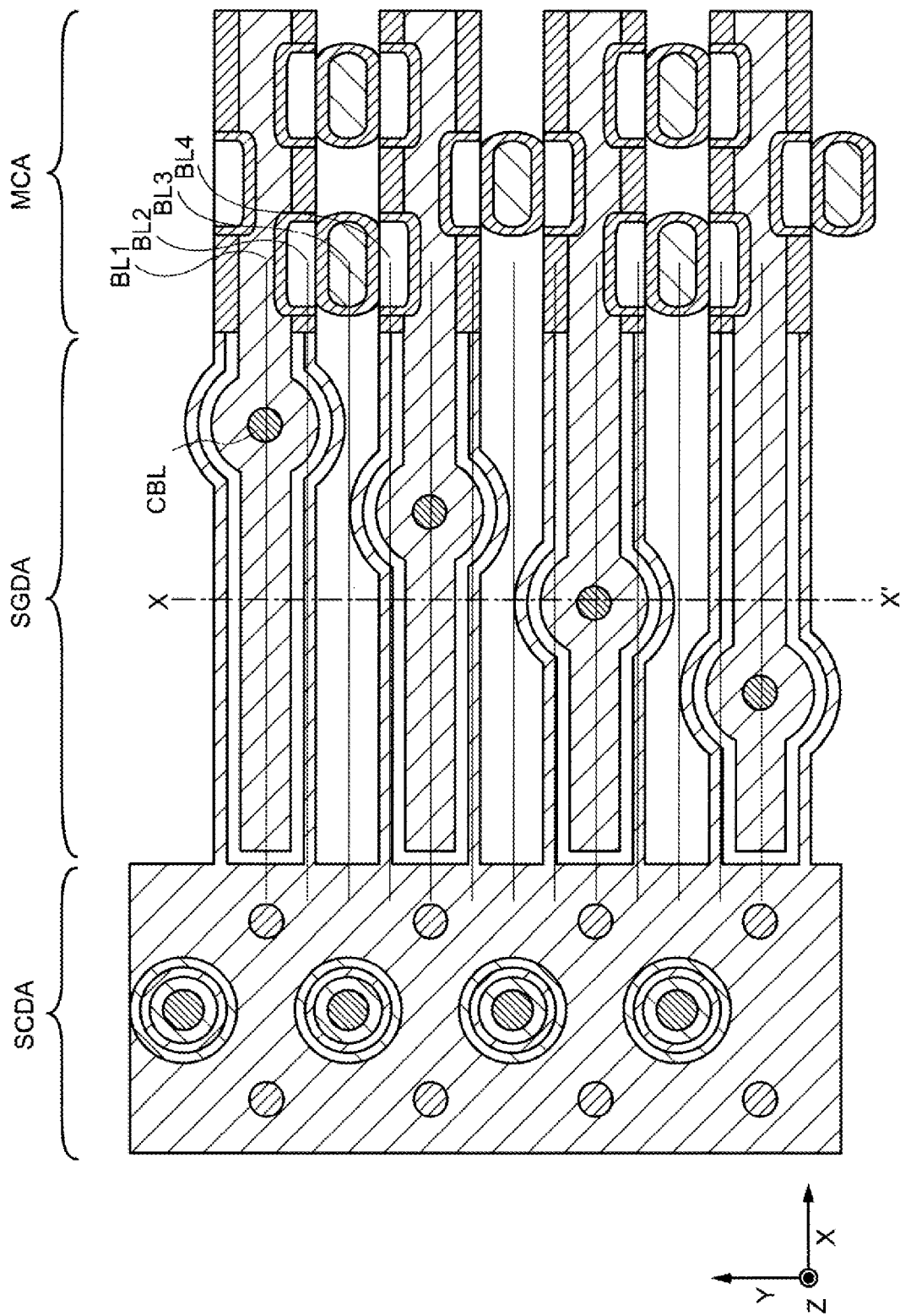
FIG. 6 is a planar view diagram showing a memory cell area and a SGD area of a nonvolatile semiconductor memory device related to a comparative example.

VGNAND of a comparative example is shown in FIG. 6 and FIG. 7. In VGNAND, one bit line BL corresponds to a plurality of pairs of memory strings MSa and MSb arranged along the Z direction. On the other hand, in the present embodiment, a plurality (four) of bit lines correspond to a plurality of pairs of memory strings MSa and MSb which are arranged along the Z direction. As a result, it is possible to reduce the block size to ¼, and increase the number of blocks by 4 times. More generally, according to the present embodiment, n bit lines are made to correspond to a plurality of pairs or a plurality of memory strings arranged along the Z direction, and it is possible to reduce the block size to 1/n and increase the number of blocks by n times. As a result, according to this embodiment, it is possible to facilitate a control of VGNAND by a memory controller and suppress disturb (unintended programming) to non-selected cells within a block.

Although a number of embodiments of the present disclosure have been explained above, these embodiments are shown as an example and are not intended to limit the scope of the invention. These novel embodiments can be implemented in various other forms, and various omissions, substitutions and modifications can be carried out without departing from the scope of the invention. These embodiments and their modifications are included in the scope and the gist of the invention and are included in the invention described in the claims and equivalents thereof.

What is claimed is:

1. A nonvolatile semiconductor memory device comprising:
   a memory string group including k stacked memory strings stacked in a stacking direction, each of the memory strings stacked in a different layer perpendicular to the stacking direction and including a plurality of nonvolatile memory cells connected in series, k being an integer of 2 or more;
   a selection transistor group including k selection transistors, each of the k selection transistors corresponding to each of the k memory strings respectively, the selection transistor group divided into n selection transistor sub-groups, each of the n selection transistor sub-groups including k/n selection transistors, n being an integer of 2 or more;
   n bit lines arranged in parallel to each of the k memory strings; and
   n bit line contacts arranged perpendicularly, each of the n bit line contacts connected to each of the n bit lines respectively, each of the n bit line contacts connected to the k/n selection transistors belonging to the each of the n selection transistor sub-group respectively.

2. The nonvolatile semiconductor memory device according to claim 1, wherein the k/n selection transistors belonging to the n selection transistor sub-group are stacked in the periphery of the corresponding n bit line contacts.

3. The nonvolatile semiconductor memory device according to claim 1, wherein each of the k memory string forms a memory string pair on two columns, and a bit line is arranged at a pitch of ¼ of the pitch of the memory string pair is arranged, and n equals 4.

4. The nonvolatile semiconductor memory device according to claim 2, wherein each of the n bit line contacts is formed with an insulation layer in a periphery of a part not connected with corresponding k/n selection transistors.

5. The nonvolatile semiconductor memory device according to claim 1 further comprising:
   a row decoder for selecting a plurality of selection transistors at the same time for each of the n selection transistor sub-groups.

6. The nonvolatile semiconductor memory device according to claim 1, wherein the memory string group connected with the selection transistor group forms one block.

7. The nonvolatile semiconductor memory device according to claim 6, wherein a memory cell of a memory string belonging to the block is deleted for each block.

8. The nonvolatile semiconductor memory device according to claim 2, wherein each of the k memory string forms a memory string pair on two columns, and a bit line is arranged at a pitch of ¼ of the pitch of the memory string pair is arranged, and n equals 4.

9. The nonvolatile semiconductor memory device according to claim 2 further comprising:
   a row decoder for selecting a plurality of selection transistors at the same time for each of the n selection transistor sub-groups.

10. The nonvolatile semiconductor memory device according to claim 2, wherein the memory string group connected with the selection transistor group forms one block.

11. The nonvolatile semiconductor memory device according to claim 10, wherein a memory cell of a memory string belonging to the block is deleted for each block.

12. The nonvolatile semiconductor memory device according to claim 3 further comprising:
   a row decoder for selecting a plurality of selection transistors at the same time for each of the n selection transistor sub-groups.

13. The nonvolatile semiconductor memory device according to claim 3, wherein the memory string group connected with the selection transistor group forms one block.

14. The nonvolatile semiconductor memory device according to claim 13, wherein a memory cell of a memory string belonging to the block is deleted for each block.

15. The nonvolatile semiconductor memory device according to claim 4 further comprising:
   a row decoder for selecting a plurality of selection transistors at the same time for each of the n selection transistor sub-groups.

16. The nonvolatile semiconductor memory device according to claim 4, wherein the memory string group connected with the selection transistor group forms one block.

17. The nonvolatile semiconductor memory device according to claim 16, wherein a memory cell of a memory string belonging to the block is deleted for each block.

18. The nonvolatile semiconductor memory device according to claim 5, wherein the memory string group connected with the selection transistor group forms one block.

19. The nonvolatile semiconductor memory device according to claim 18, wherein a memory cell of a memory string belonging to the block is deleted for each block.

* * * * *